(12) United States Patent
Werschnik et al.

(10) Patent No.: US 9,110,380 B2
(45) Date of Patent: Aug. 18, 2015

(54) EXPOSURE DEVICE FOR THE STRUCTURED EXPOSURE OF A SURFACE

(75) Inventors: Jan Werschnik, Jena (DE); Markus Augustin, Jena (DE); Lutz Reichmann, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 134 days.

(21) Appl. No.: 13/820,399

(22) PCT Filed: Mar. 8, 2012

(86) PCT No.: PCT/DE2012/100056
§ 371 (c)(1),
(2), (4) Date: Mar. 1, 2013

(87) PCT Pub. No.: WO2012/136199
PCT Pub. Date: Oct. 11, 2012

(65) Prior Publication Data
US 2014/0118711 A1    May 1, 2014

(30) Foreign Application Priority Data
Apr. 4, 2011 (DE) .................. 10 2011 001 785

(51) Int. Cl.
*G03F 7/20* (2006.01)
*G02B 26/08* (2006.01)
*G02B 3/00* (2006.01)
*H01L 21/67* (2006.01)

(52) U.S. Cl.
CPC .......... *G03F 7/70208* (2013.01); *G02B 3/0056* (2013.01); *G02B 26/0841* (2013.01); *G03F 7/7005* (2013.01); *G03F 7/70291* (2013.01); *H01L 21/67069* (2013.01)

(58) Field of Classification Search
CPC    G02B 26/0841; G02B 3/0056; G03F 7/7005; G03F 7/70208; G03F 7/70291; H01L 21/67069
See application file for complete search history.

(56) References Cited

U.S. PATENT DOCUMENTS

| 5,229,872 A * | 7/1993 | Mumola ........................... 349/2 |
| 5,298,365 A * | 3/1994 | Okamoto et al. ............. 430/311 |
| 5,329,335 A * | 7/1994 | Wada et al. ..................... 355/53 |
| 5,369,464 A * | 11/1994 | Kamon .......................... 355/43 |
| 6,133,986 A * | 10/2000 | Johnson .......................... 355/67 |
| 6,407,766 B1 * | 6/2002 | Ramanujan et al. .......... 347/239 |
| 6,876,494 B2 | 4/2005 | Ishikawa et al. |
| 7,227,613 B2 | 6/2007 | Ryzhikov et al. |
| 2004/0223129 A1 * | 11/2004 | Ishikawa et al. ................ 355/53 |
| 2004/0239909 A1 | 12/2004 | Bleeker et al. |
| 2008/0304030 A1 * | 12/2008 | Lous ............................... 355/53 |
| 2009/0135396 A1 * | 5/2009 | Mizuno et al. .................. 355/71 |
| 2009/0257044 A1 * | 10/2009 | Sewell et al. ................... 355/71 |

* cited by examiner

*Primary Examiner* — Steven H Whitesell Gordon
(74) *Attorney, Agent, or Firm* — Duane Morris LLP

(57) ABSTRACT

The invention relates to an exposure device (14) for the structured exposure of a wafer, having at least one exposure arrangement with which a beam that is separated into two sub-beams is modulated via two micromirror arrays in order to increase the throughput speed during the exposure of wafers.

5 Claims, 3 Drawing Sheets

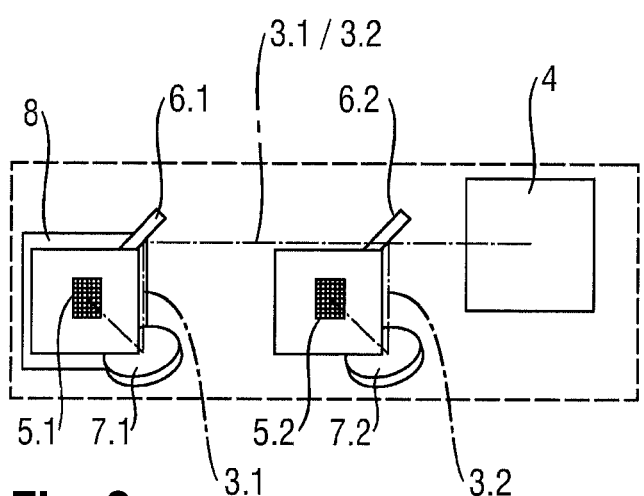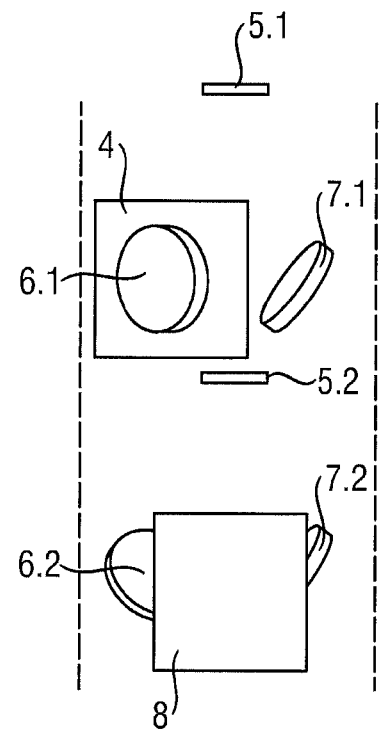
Fig. 3a
Fig. 3b
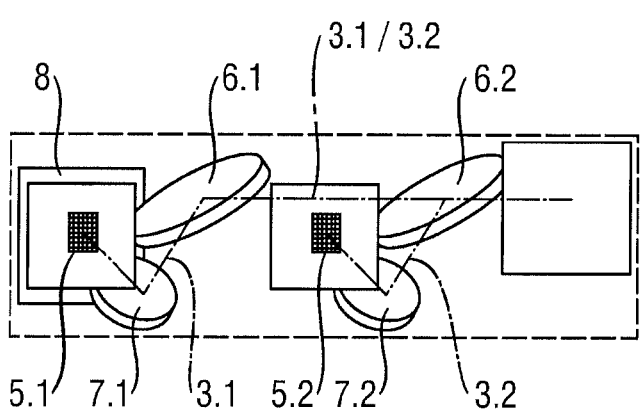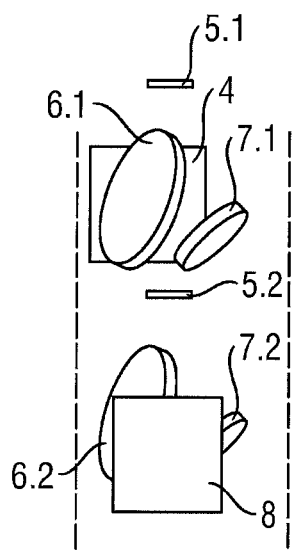
Fig. 4a
Fig. 4b

EXPOSURE DEVICE FOR THE STRUCTURED EXPOSURE OF A SURFACE

RELATED APPLICATIONS

The present application is a U.S. National Stage application of International PCT Application No. PCT/DE2012/100056 filed on Mar. 8, 2012 which claims priority benefit of German Application No. DE 10 2011 001 785.2 filed on Apr. 4, 2011, the contents of each are incorporated by reference in their entirety.

BACKGROUND OF THE INVENTION

The invention relates to an exposure device having at least one exposure arrangement for the structured exposure of a surface, for example the surface of a wafer, as is known generically from U.S. Pat. No. 6,876,494 B2.

In conventional exposure arrangements, as are used in optical lithography, a wafer is structured, that is to say exposed using a predetermined structure pattern (exposure structure), in which a mask is projected onto a wafer or is brought into contact therewith. Disadvantages here are the manufacturing complexity in producing the masks, which is significant in particular during flat-panel display production owing to the necessary size, and the limited possible use in each case only for exposure with a single exposure structure.

U.S. Pat. No. 6,876,494 B2 discloses an exposure arrangement with which light in a predetermined exposure structure (structure pattern) is projected onto a wafer by spatially modulating the light via a micromirror array.

Like other exposure arrangements known from the prior art, the exposure arrangement disclosed here includes, arranged along an optical axis, a planar emitter, a micromirror array (referred to below as DMD=Digital Micro Mirror Device), a condenser system, which is arranged upstream of the DMD in the radiation direction and homogenizes the ray bundle emitted by the planar emitter, for illuminating the DMD, a microlens array (referred to below as MLA) having a number and arrangement of microlenses corresponding to the micromirrors of the DMD, a first imaging system, which is arranged upstream of the MLA in the radiation direction, for imaging the portions of the ray bundle that are reflected by the micromirrors onto the respectively corresponding microlenses, and a second optically imaging system, which images the light portions focused by the microlenses onto the surface to be exposed.

It is the object of U.S. Pat. No. 6,876,494 B2 to increase the quality of the imaging by way of two different measures.

For this purpose, firstly an exposure arrangement is intended to be provided, in which a magnifying imaging system is produced by combining optically imaging systems with a microlens array, wherein a deterioration of the absorption ratio, caused by distortion, is intended to be avoided.

Secondly, an apparatus is intended to be provided, in which a microlens array is combined with an aperture array, and the relative spacing between the microlens array and the aperture array in the direction of the optical axis can be set precisely.

The first object is achieved by configuring the first and the second optically imaging system as image-magnifying systems and by the desired magnification resulting as the product of the magnification of both systems. It is therefore possible to configure the two individual imaging systems such that they are small, as a result of which a deterioration of the distortion characteristic is avoided and a satisfactory absorption ratio is achieved.

The second object is achieved by forming, on the microlens array or on the aperture array, at least one protrusion in the direction of the other array, which protrusion has a predetermined height in the direction of the optical axis and determines the spacing of the arrays. The relative position of the arrays with respect to each other in the direction of the optical axis can thus be set precisely, with the result that the apertures are situated in the focal planes of the microlenses.

Instead of the at least one protrusion, it is also possible for a spacer with a predetermined thickness to be placed between the microlens array and the aperture array.

In summary, the measures achieving the object in U.S. Pat. No. 6,876,494 B2 serve to improve the quality of the structured exposure by virtue of the structure being imaged more sharply and with a more homogeneous intensity.

Considerations relating to an increase in throughput rate can also be found in U.S. Pat. No. 6,876,494 B2.

The throughput rate is the rate at which a surface to be exposed is completely exposed. This rate is determined by the minimum time interval with which the exposure can take place and by the size of the partial surface, as a ratio of the total surface to be exposed, that is exposed in each case at the same time.

This ratio can be improved if, rather than just one exposure arrangement, a plurality of exposure arrangements, which in each case expose a partial surface of the total surface to be exposed with an exposure structure and together form an exposure device, are arranged next to one another, for example, in a row or in a plurality of rows which are offset relative to one another.

The minimum time interval between exposures, which determines the maximum exposure frequency, is limited by the loading time for a structure pattern into the memory cells of the DMD (each micromirror has an associated memory cell). This loading time results from the number of duty cycles for processing the command, the clock frequency, which is currently 400 MHz, and the number of memory cells to be loaded at the same time (referred to as blocks).

The modulation rate is the number of possible modulations of a DMD, or of the mirror elements of the DMD, which play a role in the formation of the structure pattern for the exposure, per unit time.

For a switching operation of a DMD with, for example, 1024×768 mirror elements to be switched, as is available from Texas Instruments under the name: DLP Discovery.? XGA 2xLVDS 12° Type A, and a DMD clock frequency of 400 MHz, the result is a typical modulation frequency of 20 kfps (kilo frames per second).

U.S. Pat. No. 6,876,494 B2 proposes to increase the modulation rate and thus the maximum exposure frequency by using only some of the mirror elements of a DMD to form the exposure structure. In this case, all the mirror elements over the width of the DMD which are arranged perpendicular to the transport direction of the surface to be exposed should be used, but only some of the mirror elements that are arranged in the transport direction.

This solution has several side effects:

In the case of an already existing exposure arrangement, the DMD is illuminated over a given surface area. However, if only the x-th part of the DMD surface is used, the (1-x)th part of the illuminated surface remains unused (loss of efficiency).

If the exposure arrangement is variable or already designed for a smaller surface, the following side effects exist:

A defined rotation of the DMD (U.S. Pat. No. 6,876,494 B2; cf. FIG. 8A and 8B "p2"), which is intended to increase the resolution (FIG. 8B "p2"), results in a specific number of repetitions of the exposures of a given point. The repeated exposure of a point improves the uniformity of the exposure. However, if fewer elements are used, the number of repetitions drops and the dose per repetition needs to be increased. The uniformity, which results from averaging, decreases.

SUMMARY OF THE INVENTION

The invention is based on the object of providing an exposure device having at least one exposure arrangement with which a comparatively higher throughput rate can be achieved.

Moreover, the exposure device should be compact, and every single exposure arrangement should be accessible.

This object is achieved for an exposure device for the structured exposure of a wafer, having at least one exposure arrangement, in which, one after another along an optical axis, a planar emitter, which emits a ray bundle, optical elements for imaging the ray bundle onto a downstream micromirror array for structuring the ray bundle, a first optically imaging system, a microlens array corresponding to the micromirror array, and a second optically imaging system for imaging the structured ray bundle into an image field of the exposure arrangement, which covers part of a wafer to be illuminated, in that the micromirror array is a first micromirror array in front of which a first beam splitter is disposed, which splits the ray bundle into a first and a second partial ray bundle along a first and a second optical axis, and a second micromirror array is arranged in the direction of the second partial ray bundle a second beam splitter is disposed in front of the first optically imaging system, via which beam splitter the two partial ray bundles, which have an identical optical path between the two beam splitters, are recombined into one ray bundle.

SUMMARY OF THE EMBODIMENTS OF THE INVENTION

Advantageous embodiments are described in the dependent claims.

In order to achieve a higher throughput rate, it is an essential feature of the invention that two DMDs are combined in the exposure arrangement which are operated in alternation and are imaged in a pixel-accurate and overlapping manner in order to effectively double the modulation frequency of typically 20 kfps to 40 kfps. The modulation frequency is limited in principle by the minimum time interval necessary, given by the technically required loading time for a structure pattern into the memory cells of the DMDs. Owing to the alternating driving of the two DMDs used, the modulation frequency is effectively doubled.

In order to achieve an even higher throughput increase, a plurality of exposure arrangements, which form an exposure device, are arranged in a row. The exposure arrangements are advantageously combined in terms of number and arrangement to form an exposure device such that the entire surface to be exposed with a predetermined width and a predetermined length takes place with a single scanning operation in the longitudinal direction (scanning direction) of the surface. The exposure devices therefore have to be arranged, owing to the fact that they are wider than the width of their image field, in a plurality of rows in the direction of the width of the surface to form said surface.

In order that an exposure device that is as compact as possible can be formed in which all exposure arrangements are accessible for maintenance purposes, the latter must be designed such that they are not larger than twice the width of the image field in the direction of the extent of their image field perpendicular to the scanning direction, which represents the width of the exposure device. Only two rows of exposure arrangements need thus be formed.

If these boundary conditions are observed, a plurality of exposure arrangements can be arranged, offset relative to one another, in two rows perpendicular to the scanning direction, with the result that neighboring exposure arrangements have a mutual spacing that is equal to the width of their image field in the aforementioned direction of extent. By way of a single relative movement of the exposure device with respect to the total surface to be exposed in the scanning direction, the total surface to be exposed can then be exposed.

Such an arrangement of the exposure arrangements can be used to form a comparatively compact and thus inherently robust exposure device.

In order to limit an exposure arrangement in terms of its width such that it is not larger than twice the width of the image field, mutually complementary measures are taken which are not obvious in combination to the relevant person skilled in the art. The height and the depth (in the scanning direction) of the exposure arrangement are not subject to any limitations.

The difficulty in limiting the width of the exposure arrangement to such a dimension resides, firstly, in the required oblique angle of incidence of an illuminating ray bundle onto the DMDs, as a result of which the optical axes of the exposure arrangements cannot lie in one plane. Secondly, special technical measures must be taken in order to bring both DMDs into exact positions that are optically conjugate with respect to each other, with the result that they overlie each other virtually exactly.

An essential feature of the invention is the mutually overlying interleaved beam guidance of the two partial beams running between two beam splitters, such that if possible the width of the components used for this purpose does not exceed the width that are necessarily predetermined by the extent of the beam splitters and of the DMDs.

The spatially skewed mirror arrangement of in each case two deflection mirrors arranged upstream of a DMD is advantageous for illuminating the DMDs.

Prisms with corresponding reflective surfaces could also be used instead.

The essential advantage of an exposure arrangement according to the invention is the possibility of being able to form a compact exposure device.

BRIEF DESCRIPTION OF THE DRAWINGS

An exposure device and an exposure arrangement will be explained in more detail below by way of example with reference to the drawings, in which:

FIG. 3a shows a schematic illustration of part of a first exemplary embodiment in top view;

FIG. 3b shows a schematic illustration of part of a first exemplary embodiment in front view;

FIG. 4a shows a schematic illustration of part of a second exemplary embodiment in top view; and FIG. 4b shows a schematic illustration of part of a second exemplary embodiment in front view.

DESCRIPTION OF THE EMBODIMENTS

Figure 1:
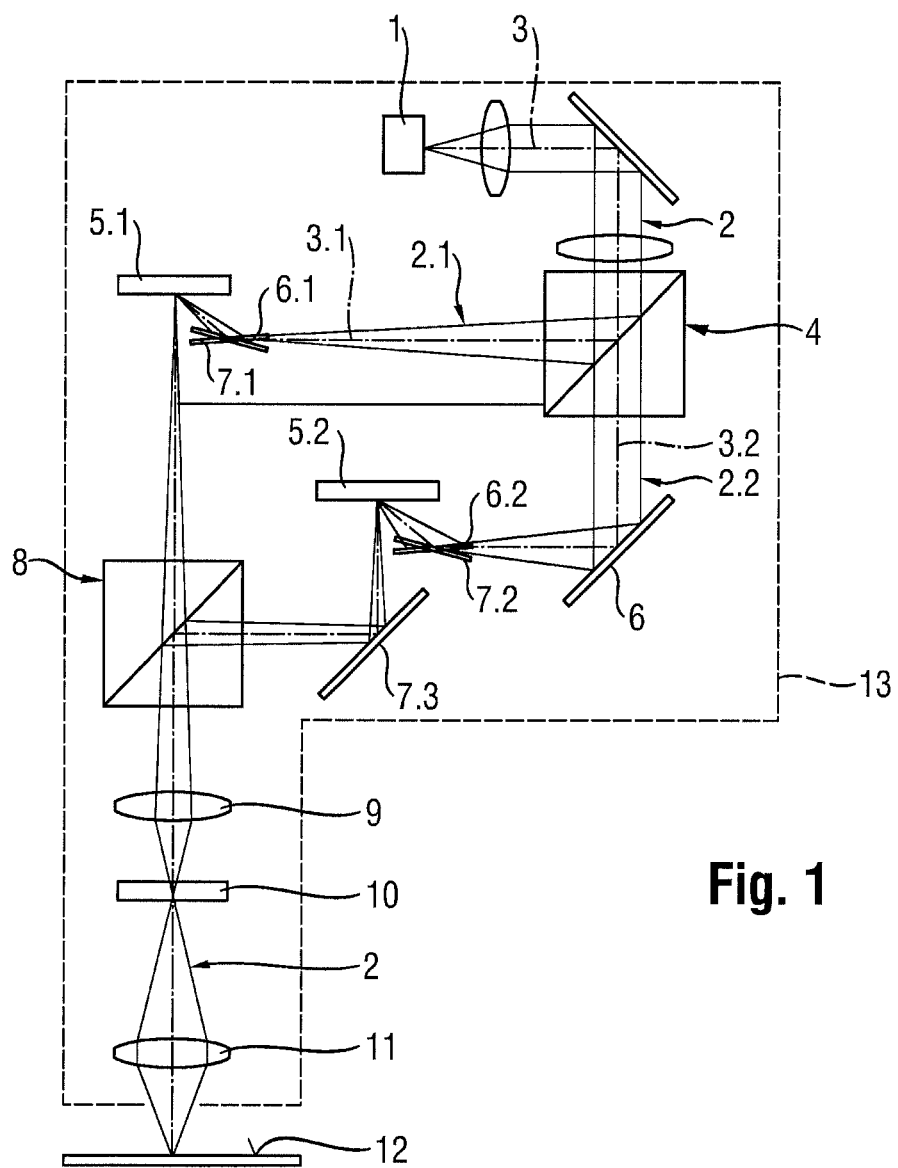
FIG. 1 shows an optics diagram of an exposure arrangement.
Figure 2:
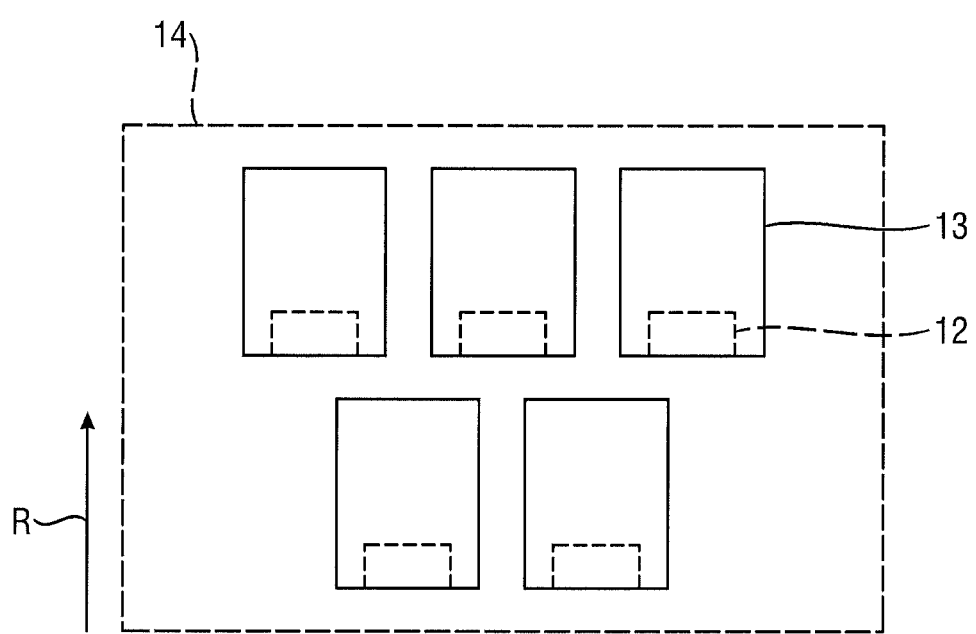
FIG. 2 shows a schematic arrangement of an exposure device having a plurality of exposure arrangements.

FIG. 1 shows an optics diagram of an exposure arrangement 13 of an exposure device 14 according to the invention.

The exposure arrangement 13 comprises a planar emitter 1 or alternatively the end of an optical fiber fed by a light source, which planar emitter emits a ray bundle 2 along an optical main axis 3. A first beam splitter 4 splits the ray bundle 2 into a first and a second partial ray bundle 2.1, 2.2, which run along a first and a second optical axis 3.1, 3.2, respectively.

Arranged on the first optical axis 3.1 is a first micromirror array 5.1, and arranged on the second optical axis 3.2 is a second, identical micromirror array 5.2. The ray bundle 2 emerging from the planar emitter 1 is homogenized in terms of its intensity distribution via optical elements, which are arranged upstream of the first beam splitter 4 on the optical main axis 3, and is adapted in terms of its cross section to the size of the micromirror arrays 5.1, 5.2, imaged on the latter. Upstream of the micromirror arrays 5.1, 5.2, front deflection mirrors 6.1, 6.2 and rear deflection mirrors 7.1, 7.2 are in an identical arrangement with respect to one another along the first and the second optical axis 3.1, 3.2, which deflection mirrors direct the partial ray bundles 2.1, 2.2 onto the micromirror arrays 5.1, 5.2 at the same predetermined angle of incidence. The micromirror arrays 5.1, 5.2 are arranged relative to the second beam splitter 8 such that, immediately or after deflection by a further deflection mirror 7.3, the partial ray bundles 2.1, 2.2 structured and reflected by the micromirror arrays 5.1, 5.2 impinge on the second beam splitter 8 recombining the partial ray bundles 2.1, 2.2 with the same orientation. Arranged downstream of the second beam splitter 8 are a first optically imaging system 9, a microlens array 10 which corresponds to the micromirror arrays 5.1, 5.2, and a second optically imaging System 11.

The design of an exposure arrangement 13 according to the invention corresponds, in the sections upstream of the first beam splitter 4 and downstream of the second beam splitter 8, to an exposure arrangement known from the prior art.

On account of the path of the partial ray bundles 2.1, 2.2 between the two beam splitters 4, 8, the optical main axis 3 upstream and downstream of the beam splitters 4 and 8 is located in two planes which are parallel with respect to each other and to the drawing plane of FIG. 1. The spacing between these planes, which also determines the width of the exposure device, is kept as small as possible.

An essential feature of the invention is the part of the optical arrangement that is enclosed by the beam splitters 4, 8. The optical path length, along the first optical axis 3.1 and the second optical axis 3.2, between the two beam splitters 4 and 8 is the same.

The beam splitters 4, 8, which are advantageously polarizing beam splitter cubes, split the ray bundle 2 into two partial ray bundles 2.1, 2.2 having a first optical axis 3.1 and a second optical axis 3.2, which run in a mutually interleaved manner, and recombine them into the optical main axis 3.

The micromirror arrays 5.1, 5.2 are oriented in the same spatial direction, that is to say the partial ray bundles 2.1, 2.2 structured thereby are reflected in the same direction.

Between their exit from the first beam splitter 4 and the micromirror arrays 5.1, 5.2, the partial beams 2.1, 2.2 must necessarily be deflected such that they impinge on the micromirror arrays 5.1, 5.2 at a predetermined angle of, for example, 24° with respect to the tilt axis of the micromirror arrays 5.1, 5.2.

Since this tilt axis is not perpendicular to the drawing plane but encloses an angle of 45°, the optical axes 3.1, 3.2 must be reflected out of the drawing plane. As a result, the exposure arrangement becomes comparatively wider.

According to the invention, in each case a front deflection mirror 6.1, 6.2 and a rear deflection mirror 7.1, 7.2 are arranged in the beam path upstream of the micromirror array 5.1, 5.2 to deflect the beam onto the micromirror arrays 5.1, 5.2, as shown in more detail in FIGS. 3a, b and 4a, b. The deflection mirrors 6.1, 6.2 and 7.1, 7.2 must have, in dependence on the diameter of the impinging ray bundle and in dependence on the angle they enclose, a minimum spacing with respect to one another in order that the first deflection mirror 6.1, 7.1 does not shade the ray bundle reflected by the second deflection mirror 6.2, 7.2. It should also be noted that the second deflection mirror 6.2, 7.2 has a sufficiently large spacing from the micromirror arrays 5.1, 5.2 so as not to shade the beam path that is reflected and thus structured by the micromirror array 5.1, 5.2.

For the purposes of further explanation, only the spatial position of the optical axes 3.1, 3.2 will now be considered in simplified terms. Since the arrangement for the deflection mirrors 6.1, 7.1 is identical to that of the deflection mirrors 6.2, 7.2, the following description relates for simplification purposes only to the path of the first partial ray bundle 2.1.

FIGS. 3a and 3b show plan and front views of a relevant partial section of a first embodiment of an exposure arrangement 13 with the arrangement of the deflection mirrors 6.1, 7.1 that is relevant to the width in question.

The first deflection mirror 6.1 (its surface normal) encloses an angle of 45° with the impinging first optical axis 3.1 in the drawing plane. It can additionally be tilted about an axis that is located on the first deflection mirror 6.1 parallel to the drawing plane. The tilting of the second deflection mirror 7.1 is in that case composed of a rotation about an axis that extends perpendicular to the drawing plane and about a more or less strong rotation about an axis that is located on the second deflection mirror 7.1 parallel to the drawing plane. The tilting of the second deflection mirror 7.1, which is situated as closely as possible to the structured partial ray bundle 2.1 reflected by the micromirror array 5.1, but without shading said partial ray bundle, has hardly any relevance to the width.

FIGS. 4a and 4b show a second embodiment, in which, in contrast to the first embodiment, the first deflection mirror 6.1 encloses an angle of more than 45° with the impinging optical axis 3.1.

The greater the angle, the closer to the second deflection mirror 7.1 over the width the deflection mirror 6.1 can be arranged, as a result of which it is possible to reduce the installation space over the width. Adapting the tilting of the second deflection mirror 7.1 to that of the first 6.1 has hardly any effect on the width. The second embodiment is thus a more advantageous embodiment as compared with the first embodiment.

In order to provide a compact exposure arrangement which permits an arrangement of a plurality of such exposure arrangements 13 next to one another that is as close as possible and thus compact, its width is not greater than twice the extent of its image field 12, such that the exposure arrangements 13 can be disposed in a row in the direction of the width with a spacing equal to the image field width. The necessary optical path length is realized over the depth of the exposure arrangement 13 in the direction perpendicular to the width, so that the image field 12 advantageously adjoins a side of the exposure arrangement 13.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE SIGNS 1 planar emitter
2 ray bundle
2.1 first partial ray bundle
2.2 second partial ray bundle
3 optical main axis
3.1 first optical axis
3.2 second optical axis
4 first beam splitter
5.1 first micromirror array (first DMD)
5.2 second micromirror array (second DMD)
6.1 first front deflection mirror
6.2 second front deflection mirror
7.1 first rear deflection mirror
7.2 second rear deflection mirror
7.3 further deflection mirror
8 second beam splitter
9 first optically imaging system
10 microlens array
11 second optically imaging System
12 image field
13 exposure arrangement
14 exposure device
R scanning direction

What is claimed is:

1. An exposure device for the structured exposure of a wafer, comprising at least one exposure arrangement, in which, one after another along an optical axis, a planar emitter, which emits a ray bundle, optical elements for imaging the ray bundle onto a downstream micromirror array for structuring the ray bundle, a first optically imaging system, a microlens array corresponding to the micromirror array, and a second optically imaging system for imaging the structured ray bundle into an image field of the exposure arrangement, which covers part of a wafer to be illuminated, wherein the micromirror array is a first micromirror array in front of which a first beam splitter is disposed, which splits the ray bundle into a first and a second partial ray bundle along a first and a second optical axis and a second micromirror array is arranged in the direction of the second partial ray bundle, wherein a second beam splitter is disposed in front of the first optically imaging system, via which beam splitter the two partial ray bundles, which have an optical path of the same length between the two beam splitters, are recombined into one ray bundle,
 a first and a second front deflection mirror and a first and second rear deflection mirror arranged along the first and the second optical axis in front of the micromirror array, is such that they have identical arrangements with respect to one another, which deflection mirrors direct the partial ray bundles onto the micromirror arrays at the same predetermined angle of incidence, and the optical paths between the first beam splitter and the micromirror arrays are identical.

2. The exposure device as claimed in claim 1, wherein the micromirror arrays are arranged relative to the second beam splitter such that the partial ray bundles structured and reflected by the micromirror arrays impinge on the second beam splitter recombining the partial ray bundles with the same orientation.

3. The exposure device as claimed in claim 2, wherein the first deflection mirrors enclose an angle of more than 45° with the respectively impinging optical axis.

4. The exposure device as claimed in claim 1, wherein the exposure arrangements in each case have a width that is not greater than twice the extent of their image field.

5. The exposure device as claimed in claim 4, wherein said exposure device is formed from two rows of exposure arrangements.

* * * * *